US012635587B2

(12) United States Patent
Cui et al.

(10) Patent No.: US 12,635,587 B2
(45) Date of Patent: May 19, 2026

(54) 3D STACKED PACKAGING STRUCTURE AND MANUFACTURING METHOD THEREOF

(71) Applicant: INSTITUTE OF SEMICONDUCTORS, GUANGDONG ACADEMY OF SCIENCES, Guangzhou (CN)

(72) Inventors: Yinhua Cui, Guangzhou (CN); Wei Zheng, Guangzhou (CN); Yao Wang, Guangzhou (CN); Zhikuan Chen, Guangzhou (CN); Chuan Hu, Guangzhou (CN); Zhitao Chen, Guangzhou (CN); Chang'an Wang, Guangzhou (CN)

(73) Assignee: Institute of Semiconductors, Guangdong Academy of Sciences, Guangzhou (CN)

( * ) Notice: Subject to any disclaimer, the term of this patent is extended or adjusted under 35 U.S.C. 154(b) by 384 days.

(21) Appl. No.: 18/417,789

(22) Filed: Jan. 19, 2024

(65) Prior Publication Data

US 2024/0153913 A1 May 9, 2024

Related U.S. Application Data

(63) Continuation-in-part of application No. PCT/CN2022/125156, filed on Oct. 13, 2022.

(51) Int. Cl.
*H01L 25/065* (2023.01)
*H10P 14/69* (2026.01)
(Continued)

(52) U.S. Cl.
CPC ......... *H10W 90/00* (2026.01); *H10P 14/6902* (2026.01); *H10W 20/023* (2026.01);
(Continued)

(58) Field of Classification Search
CPC .............. H10W 90/00; H10W 20/023; H10W 20/0253; H10P 90/00; H10P 14/6902
See application file for complete search history.

(56) References Cited

U.S. PATENT DOCUMENTS 8,157,914 B1 * 4/2012 Sung ..................... C30B 25/186
438/34
9,099,424 B1 * 8/2015 Sekar .................. H10W 20/423
(Continued)

FOREIGN PATENT DOCUMENTS

| CN | 107492533 | 12/2017 |
| CN | 114823576 | 7/2022 |
| WO | 2022/027222 | 2/2022 |

*Primary Examiner* — Thao P Le
(74) *Attorney, Agent, or Firm* — Dicke, Billig & Czaja, PLLC

(57) ABSTRACT

A 3D stacked packaging structure and a manufacturing method thereof are provided. The 3D stacked packaging structure includes a bottom-layer structure and a top-layer structure stacked thereon. The bottom-layer structure and the top-layer structure each include: a substrate layer; a diamond layer grown on the substrate layer; an ion-implanted silicon wafer layer attached to the diamond layer; and a component layer provided on the silicon wafer layer, with the four layers stacked together in sequence, wherein the substrate layer of the top-layer structure is in contact with the component layer of the bottom-layer structure, and at least one through hole provided between the bottom-layer structure and the top-layer structure, extends through the component layer, the ion-implanted silicon wafer layer, the diamond layer, and the substrate layer of the top-layer structure, and extends through the component layer of the bottom-layer structure, and is filled with a conductive material.

20 Claims, 7 Drawing Sheets

(51) Int. Cl.
| | |
|---|---|
| *H10W 20/00* | (2026.01) |
| *H10W 90/00* | (2026.01) |
| *H10W 72/20* | (2026.01) |
| *H10W 72/30* | (2026.01) |
| *H10W 74/00* | (2026.01) |

(52) U.S. Cl.
CPC ........ *H10W 72/221* (2026.01); *H10W 72/244* (2026.01); *H10W 72/321* (2026.01); *H10W 72/342* (2026.01); *H10W 74/00* (2026.01)

(56) References Cited

U.S. PATENT DOCUMENTS

| | | | |
|---|---|---|---|
| 10,236,273 B2 | 3/2019 | Wang et al. | |
| 11,810,986 B2 * | 11/2023 | Yang ..................... | H10F 77/933 |
| 2005/0046002 A1 | 3/2005 | Lee et al. | |
| 2013/0093091 A1 | 4/2013 | Ma et al. | |
| 2013/0237054 A1 * | 9/2013 | Farooq ................ | H10P 76/4085 |
| | | | 438/653 |
| 2014/0367753 A1 * | 12/2014 | Huang ................. | H10D 30/021 |
| | | | 438/294 |
| 2021/0296155 A1 * | 9/2021 | Or-Bach ................. | H10P 72/74 |
| 2023/0034595 A1 * | 2/2023 | Cardona ........... | H03H 9/02228 |
| 2024/0071938 A1 * | 2/2024 | Ecton ................. | H10W 70/635 |
| 2025/0062136 A1 * | 2/2025 | Chung ................. | H10W 74/01 |

* cited by examiner

3D STACKED PACKAGING STRUCTURE AND MANUFACTURING METHOD THEREOF

CROSS-REFERENCE TO RELATED APPLICATIONS

The present disclosure is a continuation-in-part application of International application PCT/CN2022/125156 filed on Oct. 13, 2022, and entitled "3D STACKED PACKAGING STRUCTURE AND MANUFACTURING METHOD THEREOF", the contents of which are incorporated herein by reference in entirety.

TECHNICAL FIELD

The present disclosure relates to the field of semiconductor packaging technology, and particularly, to a 3D stacked packaging structure and a manufacturing method thereof.

BACKGROUND ART

Recently, the level of integration of electronic device packaging has increased day by day, and 3D multi-layer stacked packaging technology has become extremely popular. In the well-known related technologies, the multi-layer stacked packaging structures generally use silicon substrates as bases.

SUMMARY

Exemplary embodiments of the present disclosure provide a 3D stacked packaging structure, and the 3D stacked packaging structure may include a bottom-layer structure and a top-layer structure, wherein the top-layer structure is stacked on the bottom-layer structure, and each of the bottom-layer structure and the top-layer structure includes: a substrate layer; a diamond layer, wherein the diamond layer is grown on the substrate layer; an ion-implanted silicon wafer layer, wherein the ion-implanted silicon wafer layer is attached to the diamond layer; a component layer, wherein the component layer is provided on the silicon wafer layer, wherein the substrate layer, the diamond layer, the ion-implanted silicon wafer layer, and the component layer may be stacked together in sequence, and the substrate layer of the top-layer structure may be in contact with the component layer of the bottom-layer structure, and at least one through hole is provided between the bottom-layer structure and the top-layer structure, the at least one through hole extends through the component layer, the ion-implanted silicon wafer layer, the diamond layer, and the substrate layer of the top-layer structure, and extends through the component layer of the bottom-layer structure, wherein the at least one trough hole is filled with a conductive material.

Exemplary embodiments of the present disclosure further provide a method for manufacturing a 3D stacked packaging structure, the method may include the following steps:

providing a top-layer structure and a bottom-layer structure, wherein the providing the top-layer structure and the providing the bottom-layer structure, respectively, include: providing a substrate layer; growing a diamond layer on the substrate layer; attaching an ion-implanted silicon wafer layer to the diamond layer; providing a component layer on the ion-implanted silicon wafer layer; and sequentially laminating the substrate layer, the diamond layer, the ion-implanted silicon wafer layer, and the component layer together;

stacking the top-layer structure on the bottom-layer structure, to make the substrate layer of the top-layer structure in contact with the component layer of the bottom-layer structure;

providing at least one through hole between the bottom-layer structure and the top-layer structure, to make the at least one through hole extend through the component layer, the ion-implanted silicon wafer layer, the diamond layer, and the substrate layer of the top-layer structure, and extend through the component layer of the bottom-layer structure; and filling a conductive material in the at least one through hole.

BRIEF DESCRIPTION OF DRAWINGS

In order to more clearly illustrate technical solutions of embodiments of the present disclosure, drawings required for use in the embodiments will be described briefly below. It should be understood that the drawings below are merely illustrative of some embodiments of the present disclosure, and therefore should not be considered as limiting its scope. Those of ordinary skill in the art can obtain other relevant drawings from these drawings without paying inventive effort.

DETAILED DESCRIPTION OF EMBODIMENTS

Figure 1:
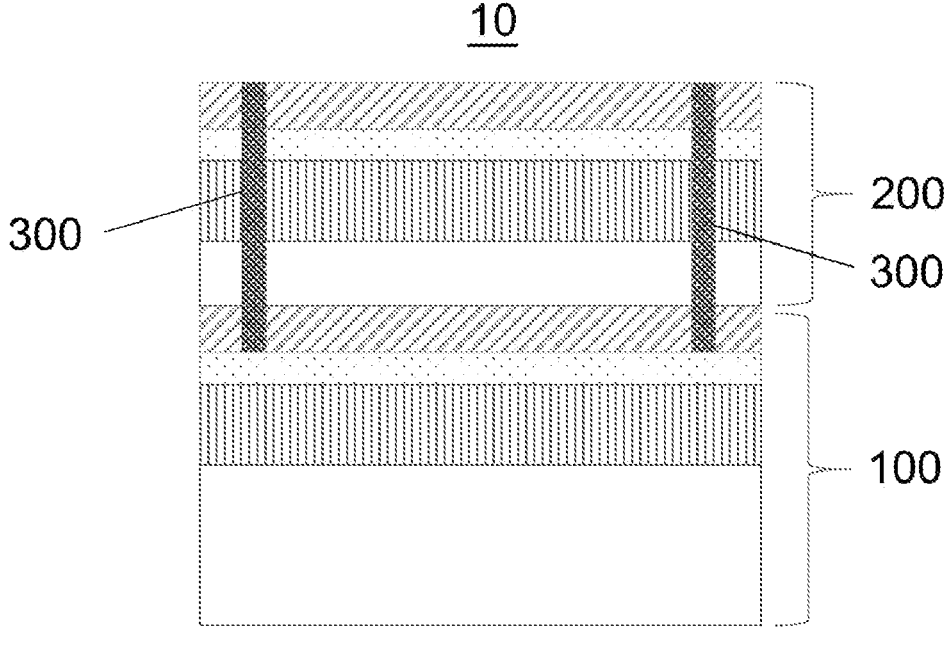
FIG. 1 is a schematic sectional view of a 3D stacked packaging structure according to an exemplary embodiment of the present disclosure, in which the 3D stacked packaging structure includes a top-layer structure and a bottom-layer structure.

The present disclosure will be described in detail below with the aid of exemplary embodiments of the present disclosure with reference to the drawings. It should be noted that the following detailed description of the present disclosure is for illustrative purposes only and does not limit the present disclosure. Furthermore, the same reference numerals used throughout the various drawings refer to the same components, the drawings are not drawn to scale, and some features are enlarged or reduced to show details of particular components.

It should also be noted that, for the sake of clarity, not all features of actual specific embodiments are described and illustrated in the specification and drawings. In addition, to avoid obscuring the technical solutions to which the present disclosure is focused, with unnecessary detail, in the specification and the drawings, only arrangements closely related to the technical content of the present disclosure are described and shown, while other details that are not closely related to the technical content of the present disclosure and are known to those skilled in the art are omitted.

In the process of researching the 3D stacked packaging structure, the inventors of the present disclosure noticed that for the multi-layer stacked packaging structure using a silicon substrate, the chip function is seriously affected due to the heating problem of electronic devices. Therefore, there is a need to improve the heat dissipation of electronic devices in multi-layer stacked packaging structures.

The inventors of the present disclosure also noticed that the diamond is used as a base due to its extremely high thermal conductivity. During the usage, the diamond is grown on the surface of the substrate and is used in only one layer of the stacked body.

The inventors of the present disclosure also noticed that the semiconductor transistors have a problem of heat concentration during operation, and that when the diamond is used as the heat dissipation substrate of the semiconductor transistors, it is very difficult to sand and polish the diamond, resulting in the manufacturing process of the semiconductor transistors more difficult.

In view of the above problems, the present disclosure provides a 3D stacked packaging structure using the diamond in more than one layer structure of a stacked packaging body and a method for manufacturing the 3D stacked packaging structure, thereby at least solving the above technical problems.

Exemplary embodiments of the present disclosure provide a 3D stacked packaging structure, and the 3D stacked packaging structure may include a bottom-layer structure and a top-layer structure, wherein the top-layer structure may be stacked on the bottom-layer structure, and each of the bottom-layer structure and the top-layer structure may include: a substrate layer; a diamond layer, wherein the diamond layer is grown on the substrate layer; an ion-implanted silicon wafer layer, wherein the ion-implanted silicon wafer layer is attached to the diamond layer; a component layer, wherein the component layer is provided on the silicon wafer layer, wherein the substrate layer, the diamond layer, the ion-implanted silicon wafer layer, and the component layer may be stacked together in sequence, and the substrate layer of the top-layer structure may be in contact with the component layer of the bottom-layer structure, and at least one through hole may be provided between the bottom-layer structure and the top-layer structure, the at least one through hole extends through the component layer, the ion-implanted silicon wafer layer, the diamond layer, and the substrate layer of the top-layer structure, and extends through the component layer of the bottom-layer structure, wherein the at least one trough hole is filled with a conductive material.

In some optional embodiments, the 3D stacked packaging structure further includes at least one middle-layer structure, the at least one middle-layer structure is located between the bottom-layer structure and the top-layer structure, and an arrangement structure of the at least one middle-layer structure is the same as an arrangement structure of the top-layer structure, wherein the at least one through hole is provided between at least two adjacent layer structures among the bottom-layer structure, the at least one middle-layer structure, and the top-layer structure.

In some optional embodiments, the component layer of at least one of the bottom-layer structure, the at least one middle-layer structure, and the top-layer structure may include semiconductor transistors, and interconnecting wires and insulating materials between the semiconductor transistors.

In some optional embodiments, the substrate layer of each of the bottom-layer structure, the top-layer structure, and the at least one middle-layer structure is thinned after the corresponding diamond layer and the component layer are stacked.

In some optional embodiments, a thickness of the substrate layer of the at least one middle-layer structure and a substrate layer of the top-layer structure may be 1 μm to 100 μm. In some optional embodiments, a thickness of the diamond layer may be 1 μm to 3 μm.

In some optional embodiments, a thickness of the ion-implanted silicon wafer layer may be 1 μm to 10 μm.

In some optional embodiments, the component layer of at least one of the bottom-layer structure, the at least one middle-layer structure, and the top-layer structure includes a functional chip, and the substrate layer adjacent to the component layer of the at least one of the bottom-layer structure, the at least one middle-layer structure, and the top-layer structure is rewired and provided with interconnection structures communicating with the component layer of the at least one of the bottom-layer structure, the at least one middle-layer structure, and the top-layer structure.

In some optional embodiments, wherein the functional chip may include semiconductor transistors, each of the semiconductor transistors may include a dielectric layer, a source provided in the dielectric layer, a drain provided in the dielectric layer, and a gate provided on the dielectric layer, the silicon wafer layer of at least one of the bottom-layer structure, the at least one middle-layer structure, and the top-layer structure may include a source doped region and a drain doped region located at two ends of the silicon wafer layer, and an undoped region located at a middle position of the silicon wafer layer, the source and the drain of the semiconductor transistor may be formed above the source doped region and the drain doped region respectively, and the gate of the semiconductor transistor may be formed above the undoped region.

In some optional embodiments, the semiconductor transistor may further include an isolating layer, wherein the isolating layer extends through the corresponding silicon wafer layer and is in contact with the corresponding diamond layer.

In some optional embodiments, the component layer of the top-layer structure is covered with a plastic package layer.

Next, the 3D stacked packaging structure according to the exemplary embodiments of the present disclosure will be described in detail with reference to the drawings.

First, a 3D stacked packaging structure according to exemplary embodiments of the present disclosure will be described with reference to FIG. 1. FIG. 1 is a schematic sectional view of a 3D stacked packaging structure 10 according to an exemplary embodiment of the present disclosure.

As shown in FIG. 1, the 3D stacked packaging structure 10 as provided by an exemplary embodiment of the present disclosure may include a bottom-layer structure 100 and a top-layer structure 200. In some embodiments, the top-layer structure 200 is stacked on the bottom-layer structure 100.

In the illustrated exemplary embodiment, each of the bottom-layer structure 100 and the top-layer structure 200 may include a substrate layer 110, a diamond layer 120, a silicon wafer layer 130, and a component layer 140. In the exemplary embodiment of the present disclosure, the substrate layer 110 may be a silicon substrate, however, other types of substrates may also be used. In some embodiments, the diamond may be a single crystal diamond. In other embodiments, the diamond may be a polycrystalline diamond. In yet other embodiments, the diamond may be a composite material of two or more kinds of diamonds, and particularly, a composite material of the single crystal diamond and the polycrystalline diamond. In some embodiments of the present disclosure, the silicon wafer layer 130 is implanted with ions and the film is subsequently peeled off. It should be understood that any suitable ion is feasible. In some embodiments, the component layer 140 may include semiconductor transistors, metal interconnecting wires and insulating materials between the semiconductor transistors.

In some exemplary embodiments, the diamond layer 120 may be grown on the substrate layer 110, the ion-implanted silicon wafer layer 130 may be attached to the diamond layer 120, and the component layer 140 may be provided on the silicon wafer layer 130, which will be described in detail below.

In some embodiments of the present disclosure, the substrate layer 110, the diamond layer 120, the ion-implanted silicon wafer layer 130, and the component layer 140 may be laminated together in this sequence. In an exemplary embodiment, the substrate layer 110 of the top-layer structure 200 may be in contact with the component layer 140 of the bottom-layer structure 100.

In the illustrated exemplary embodiment of the present disclosure, at least one through hole 300 may be provided between the bottom-layer structure 100 and the top-layer structure 200. In some exemplary embodiments, the at least one through hole 300 may extend through the component layer 140, the ion-implanted silicon wafer layer 130, the diamond layer 120, and the substrate layer 110 of the top-layer structure 200, and extend through the component layer 140 of the bottom-layer structure 100.

In some embodiments, the at least one through hole 300 may be filled with a conductive material. As an example, rather than a limitation, the conductive material may be copper. Those skilled in the art will understand that the conductive material may be any other suitable material.

In the 3D stacked packaging structure 10 according to the exemplary embodiment of the present disclosure, a good heat dissipation performance of the 3D stacked packaging structure 10 may be ensured by forming bases of the bottom-layer structure 100 and the top-layer structure 200 in the stacked packaging body with the diamond having high thermal conductivity.

Next, the formation process of the bottom-layer structure of the 3D stacked packaging structure according to the exemplary embodiments of the present disclosure will be explained with reference to FIG. 2 to FIG. 7.

Figure 2:
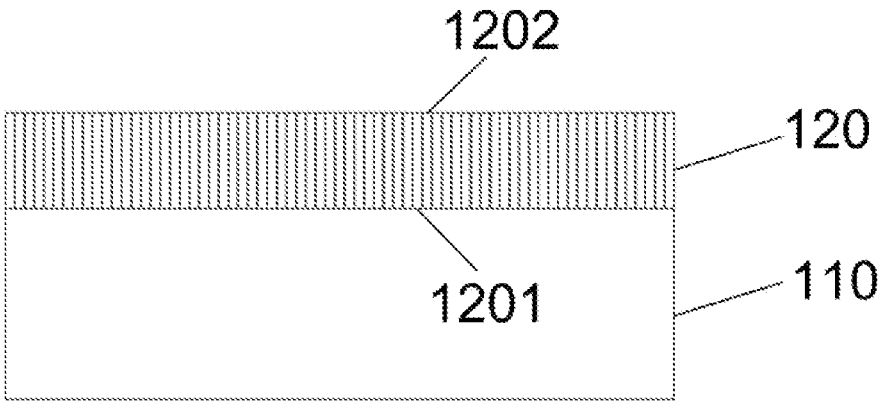
FIG. 2 is a schematic sectional view of growing a diamond layer on a substrate layer of the 3D stacked packaging structure according to an exemplary embodiment of the present disclosure.

First, referring to FIG. 2, FIG. 2 is a schematic sectional view of growing a diamond layer 120 on a substrate layer 110 of the 3D stacked packaging structure 10 according to an exemplary embodiment of the present disclosure.

As shown in FIG. 2, first, the substrate layer 110 of the 3D stacked packaging structure 10 may be provided. In the illustrated exemplary embodiment of the present disclosure, the substrate layer 110 may be a silicon substrate. However, the embodiment of the present disclosure are not limited thereto. For example, a glass substrate may be used as the substrate layer 110. In some embodiments, the substrate layer 110 has a thickness of 10 μm to 3000 μm, preferably 100 μm to 1000 μm, which is only an example but not a limitation. Then, with any surface of the substrate layer 110 as the growth interface, the diamond layer 120 is grown on the substrate layer 110. In the embodiments of the present disclosure, various growth methods of the diamond layer 120 may be used. For example, in the illustrated exemplary embodiment, the diamond layer 120 may be grown on the substrate layer 110 by using chemical vapor deposition. In other embodiments, other methods such as plasma vapor deposition may be used. In the exemplary embodiment of the present disclosure, the diamond layer 120 has a thickness of 1 μm to 3 μm. It should be understood that the thickness of the substrate layer 110 and the thickness of the diamond layer 120 may be adjusted as needed, and as an example but not a limitation, the thickness of the diamond layer 120 may be any value within the aforementioned range, such as 1.7 μm, 2.1 μm, 2.8 μm.

In the exemplary embodiment of the present disclosure, the diamond layer 120 may have an upper surface 1202 and a lower surface 1201 that are opposite to each other, where the lower surface 1201 may be in contact with the substrate layer 110. In some preferred embodiments, the surface of the grown diamond layer 120 opposite to the substrate layer 110, that is, the upper surface 1202 may be polished/ground, and the flatness of the polished surface is in a range of 0 to 100 nm. Preferably, the flatness of the polished surface is in a range of 0 to 70 nm.

Figure 4:
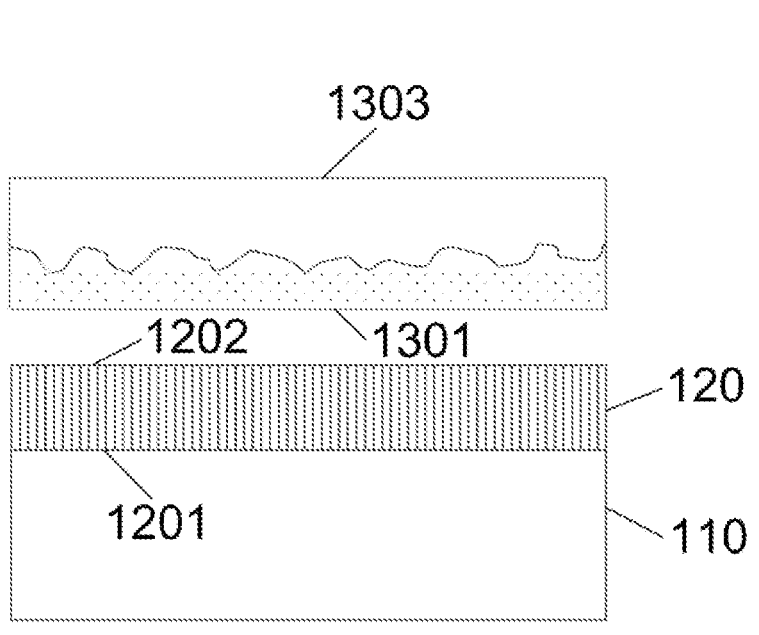
FIG. 4 is a schematic sectional view of flipping the ion-implanted silicon wafer of the 3D stacked packaging structure according to an exemplary embodiment of the present disclosure.
Figure 5:
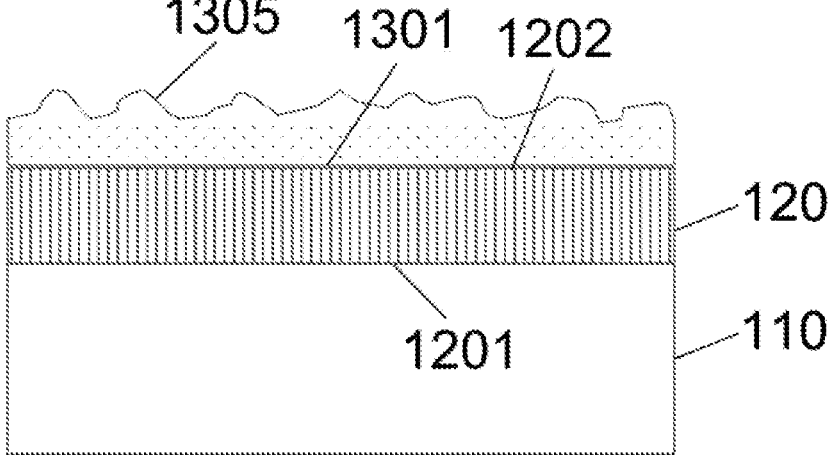
FIG. 5 is a schematic sectional view of peeling off the ion-implanted silicon wafer from the 3D stacked packaging structure according to an exemplary embodiment of the present disclosure.
Figure 6:
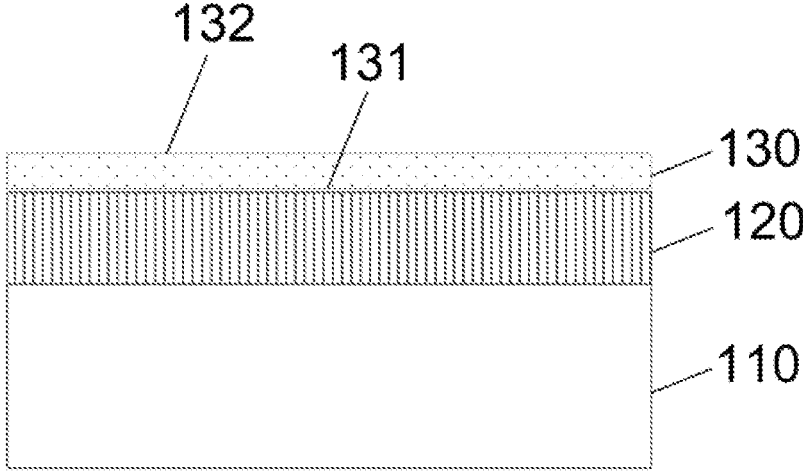
FIG. 6 is a schematic sectional view of attaching the silicon wafer layer to the diamond layer of the 3D stacked packaging structure according to an exemplary embodiment of the present disclosure, wherein a surface of the silicon wafer exposed by peeling-off is sanded.

Next, referring to FIG. 3 to FIG. 6, FIG. 3 to FIG. 6 are schematic sectional views of attaching the silicon wafer layer 130 to the diamond layer 120 of the 3D stacked packaging structure 10 according to the exemplary embodiments of the present disclosure. In some embodiments, the silicon wafer layer 130 may have the first main surface 131 and the second main surface 132 that are opposite to each other (as shown in FIG. 6).

Figure 3:
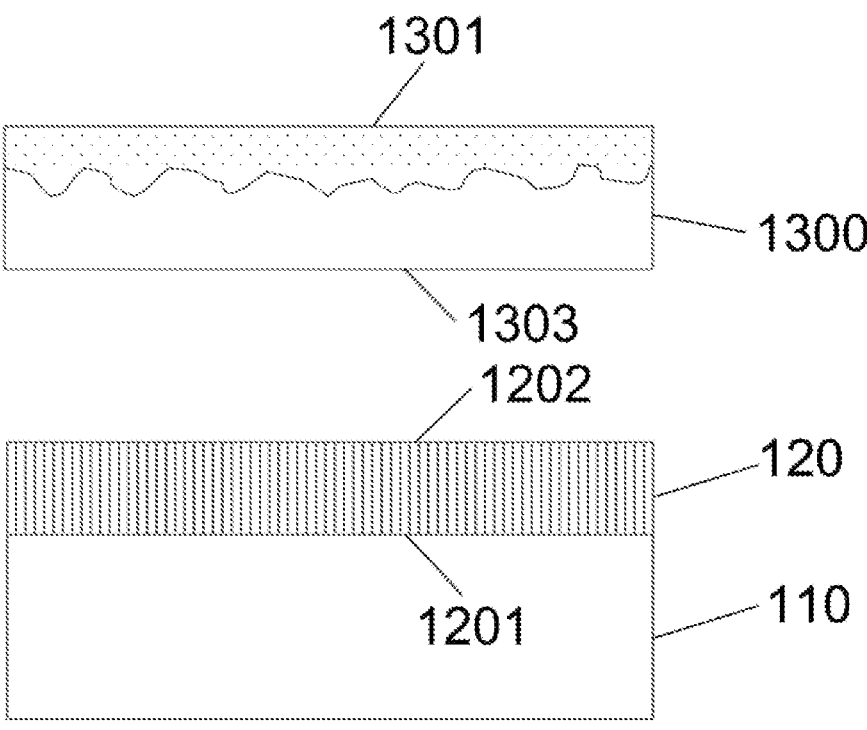
FIG. 3 is a schematic sectional view of implanting ions into a silicon wafer of the 3D stacked packaging structure according to an exemplary embodiment of the present disclosure.

Now referring to FIG. 3, FIG. 3 is a schematic sectional view of implanting ions into a silicon wafer of the 3D stacked packaging structure 10 according to an exemplary embodiment of the present disclosure.

As shown in the embodiment of FIG. 3, a silicon wafer 1300 for forming the silicon wafer layer 130 may be provided above the diamond layer 120. In the embodiments of the present disclosure, the thickness of the silicon wafer 1300 may be 100 μm to 1000 μm. In the illustrated exemplary embodiment, the silicon wafer 1300 may have a first side surface 1301 and a second side surface 1303 that are opposite to each other, and the second side surface 1303 may be closer to the diamond layer 120 than the first side surface 1301. In some embodiments of the present disclosure, the portion of the silicon wafer 1300 including the first side surface 1301 may be implanted with ions, such as hydrogen ions. The first side surface 1301 of the silicon wafer 1300 which is implanted with ions may form the first main surface 131 of the silicon wafer layer 130.

In some optional embodiments of the present disclosure, the implantation depth of ions may be 1 μm to 10 μm, preferably, the implantation depth of ions is 3 μm to 5 μm. However, the embodiments of the present disclosure are not limited thereto, for example, the implantation depth of ions may be 2 μm, 6 μm, or 9 μm.

Now referring to FIG. 4, FIG. 4 is a schematic sectional view of flipping the ion-implanted silicon wafer 1300 of the 3D stacked packaging structure 10 according to an exemplary embodiment of the present disclosure.

As shown in FIG. 4, the silicon wafer 1300 may be flipped after being implanted with ions, so that the first side surface 1301 serving as the first main surface 131 of the silicon wafer layer 130 is closer to the diamond layer 120 than the second side surface 1303.

Now referring to FIG. 5, FIG. 5 is a schematic sectional view of peeling off the ion-implanted silicon wafer from the 3D stacked packaging structure 10 according to exemplary embodiments of the present disclosure.

As shown in the exemplary embodiments of FIG. 5, after the silicon wafer 1300 is flipped, the first side surface 1301 of the silicon wafer 1300 which serves as the first main surface 131 of the silicon wafer layer 130 may be attached to the upper surface 1202 of the diamond layer 110. Then, the portion of the silicon wafer 1300 that is not implanted with ions may be peeled off, to separate the portion of the silicon wafer 1300 that is not implanted with ions from the portion of the silicon wafer 1300 that is implanted with ions, whereby the surface 1305 of the silicon wafer 1300 is exposed. In the illustrated exemplary embodiment, peeling may be performed by applying heat and pressure. However, the embodiments of the present disclosure are not limited thereto, any other method that may achieve peeling may be used, for example, electrochemical etching may be used.

Now referring to FIG. 6, FIG. 6 is a schematic sectional view of attaching the silicon wafer layer 130 attached to the diamond layer 120 of the 3D stacked packaging structure 10 according to an exemplary embodiment of the present disclosure.

As shown in FIG. 6, after the silicon wafer 1300 is peeled off, the exposed surface 1305 of the silicon wafer 1300 may be sanded to obtain the second main surface 132 of the ion-implanted silicon wafer layer 130. As an example, but not limitation, in the illustrated embodiment, the sanding may be performed by chemical mechanical polishing (CMP). As may be seen in FIG. 6, the first main surface 131 of the silicon wafer layer 130 is in contact with the diamond layer 120. In the exemplary embodiment of the present disclosure, the thickness of the ion-implanted silicon wafer layer 130 is substantially the same as the implantation depth of ions mentioned above.

Figure 7:
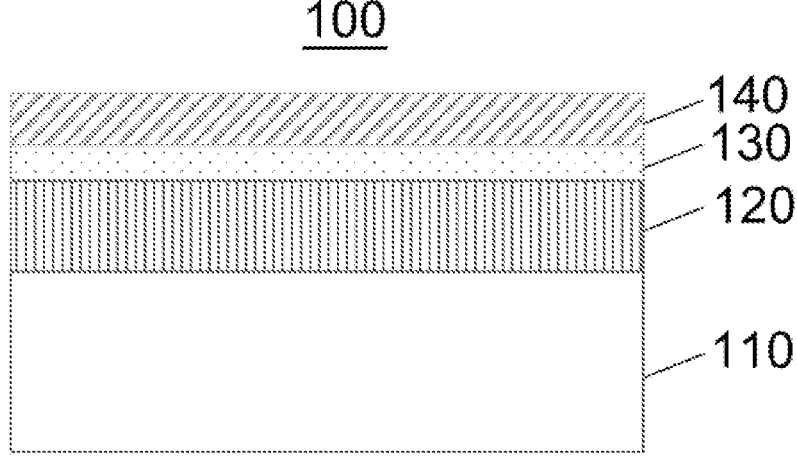
FIG. 7 is a schematic sectional view of a bottom-layer structure of the 3D stacked packaging structure according to an exemplary embodiment of the present disclosure, in which a component layer is provided on the silicon wafer layer.

Now referring to FIG. 7, FIG. 7 is a schematic sectional view of a 3D stacked packaging structure 10 according to an exemplary embodiment of the present disclosure, in which the component layer 140 is provided on the silicon wafer layer 130.

As shown in the embodiment of FIG. 7, the component layer 140 may be provided on the second main surface 132 (as shown in FIG. 6) of the silicon wafer layer 130, for forming the bottom-layer structure 100 of the 3D stacked packaging structure 10 according to exemplary embodiment of the present disclosure. Afterwards, as shown in FIG. 7, the substrate layer 110, the diamond layer 120, the ion-implanted silicon wafer layer 130 and the component layer 140 of the bottom-layer structure 100 of the 3D stacked packaging structure 10 may be laminated together in this sequence. Here, it should be noted that it is not necessary that the laminating step is performed when the substrate layer 110, the diamond layer 120, the silicon wafer layer 130, and the component layer 140 of the bottom-layer structure 100 are all placed together, but the laminating step may be performed for more than once to laminate them together. For example, when the first side surface 1301 of the silicon wafer 1300 which serves as the first main surface 131 of the silicon wafer layer 130 is attached to the upper surface 1202 of the diamond layer 110, a laminating process may be performed to laminate the first side surface 1301 to the upper surface 1202 of the diamond layer 110, and when the component layer 140 is provided on the silicon wafer layer 130, a laminating process may be performed to laminate the silicon wafer layer 130 to the component layer 140.

Figure 8:
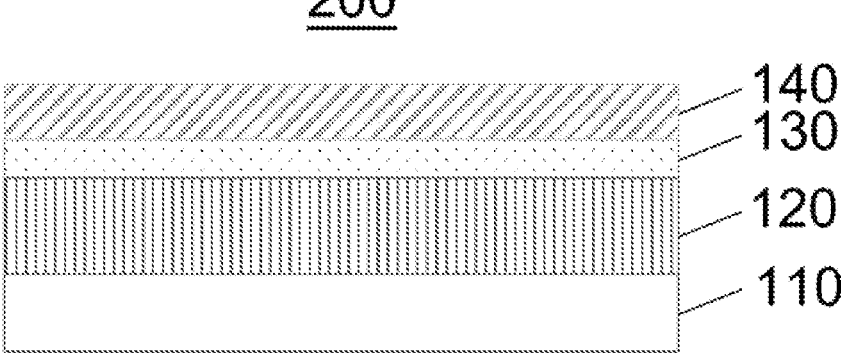
FIG. 8 is a schematic sectional view of a top-layer structure or a middle-layer structure of the 3D stacked packaging structure according to an exemplary embodiment of the present disclosure.

Next, the top-layer structure 200 of the 3D stacked packaging structure 10 according to an exemplary embodiment of the present disclosure will be described with reference to FIG. 8. FIG. 8 is a schematic sectional view of the top-layer structure 200 of the 3D stacked packaging structure 10 according to the exemplary embodiment of the present disclosure.

As shown in FIG. 8, the top-layer structure 200 of the 3D stacked packaging structure 10 may be the same as the bottom-layer structure 100 in FIG. 7, except that the thickness of the substrate layer 110 included in the top-layer structure 200 is smaller than the thickness of the substrate layer 110 of the bottom-layer structure 100. In the illustrated embodiment, the thickness of the substrate layer 110 of the top-layer structure 200 may be 1 μm to 100 μm, preferably, the thickness of the substrate layer 110 of the top-layer structure 200 is 20 μm to 80 μm, but is not limited thereto. For example, the thickness of the substrate layer 110 of the top-layer structure 200 may be 15 μm, 30 μm, 60 μm or 90 μm. Here, it should be noted that in an optional embodiment of the present disclosure, the thickness of the substrate layer 110 included in the top-layer structure 200 and the thickness of the substrate layer 110 of the bottom-layer structure 100 may be the same. In some embodiments, the substrate layer 110 of the bottom-layer structure 100 may also be removed.

Referring to FIG. 1 again, the 3D stacked packaging structure 10 of FIG. 1 is a stacked body structure obtained by stacking the top-layer structure 200 of FIG. 8 on the bottom-layer structure of FIG. 7, e.g., stacking the top-layer structure 200 of FIG. 8 on the bottom-layer structure 100 of FIG. 7 by laminating. Among them, the substrate layer 110 of the top-layer structure 200 is in contact with the component layer 140 of the bottom-layer structure 100. After the top-layer structure 200 and the bottom-layer structure 100 are stacked together, through holes 300 may be provided between the bottom-layer structure 100 and the top-layer structure 200. In the illustrated exemplary embodiment, the through holes 300 may extend through the component layer 140, the ion-implanted silicon wafer layer 130, the diamond layer 120, and the substrate layer 110 of the top-layer structure 200, and extend through the component layer 140 of the bottom-layer structure 100. In some preferred embodiments of the present disclosure, the through holes 300 may be each filled with a conductive material, such as copper. However, the embodiments of the present disclosure are not limited thereto.

Figure 9:
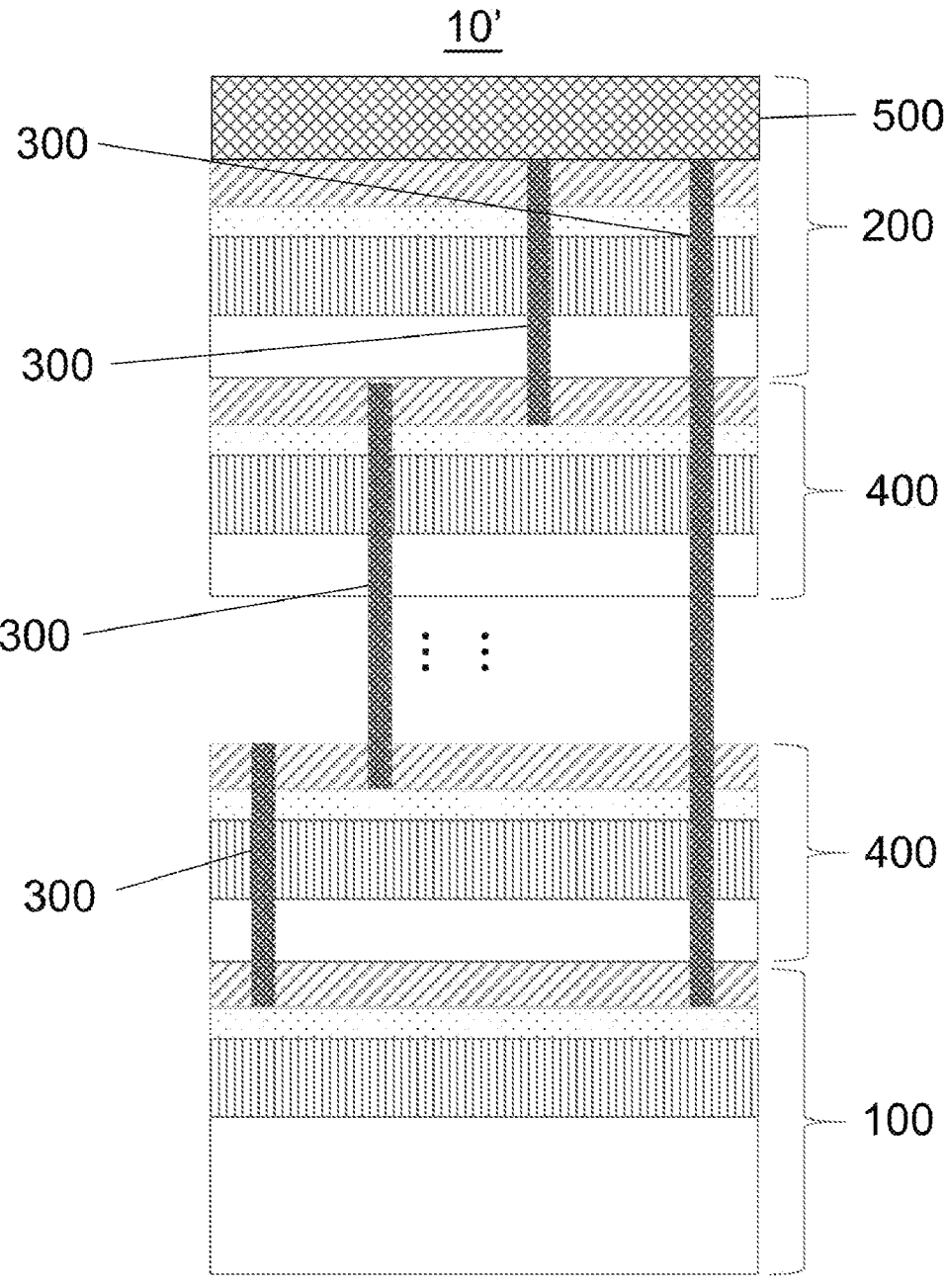
FIG. 9 is a schematic sectional view of the 3D stacked packaging structure according to another exemplary embodiment of the present disclosure, in which the 3D stacked packaging structure includes a top-layer structure, a middle-layer structure, and a bottom-layer structure.
Figure 10:
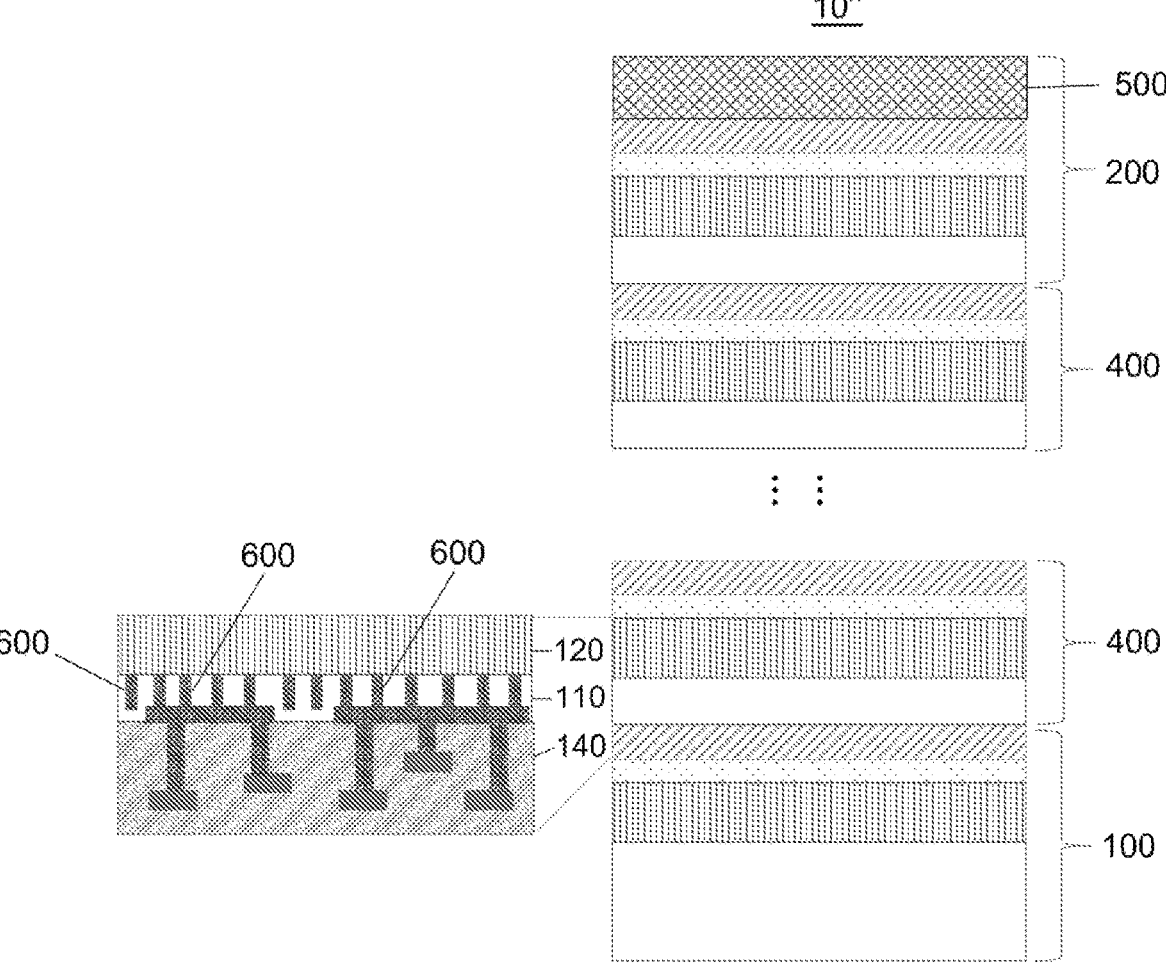
FIG. 10 is a schematic sectional view of the 3D stacked packaging structure according to another exemplary embodiment of the present disclosure, in which the substrate layer adjacent to the component layer of the middle-layer structure is rewired and provided with at least one through hole.

In addition, according to an optional embodiment of the present disclosure, the component layer side of the top-layer structure 200, that is, the side where the component layer 140 is located may be covered with a plastic-sealing layer 500 (as shown in FIG. 9 and FIG. 10). In some embodiments, the plastic package layer 500 may be made of resin. It should be understood that the plastic package layer 500 may be made of any other suitable materials, such as it may be made of epoxy resin filled with fillers such as aluminum nitride.

Through the above arrangement according to the exemplary embodiment of the present disclosure, since the diamond with high thermal conductivity is used to form a base in more than one layer structure of the 3D stacked packaging structure, the heat dissipation performance of the formed 3D stacked packaging structure is guaranteed. In addition, by reducing the thickness of the substrate layer of the top-layer structure and providing the at least one through hole in the 3D stacked packaging structure, the heat dissipation performance of the 3D stacked packaging structure is further improved. Not only that, in the 3D stacked packaging structure according to the embodiment of the present disclosure, as described by the dimensions mentioned above, the 3D stacked packaging structure constructed is ultra-thin by forming the base of each layer structure using the diamond layer, substrate layer, and silicon wafer layer which are of smaller thicknesses, i.e. are thinner, which provides a high-heat-dissipation ultra-thin packaging process and solves the technical defects of high-density packaging processes in related technologies.

The 3D stacked packaging structure according to some optional exemplary embodiments of the present disclosure will be described below.

Referring to FIG. 9, FIG. 9 is a schematic sectional view of a 3D stacked packaging structure 10' according to another exemplary embodiment of the present disclosure.

The difference between the 3D stacked packaging structure 10' according to the illustrated embodiment shown in FIG. 9 and the aforementioned 3D stacked packaging structure 10 according to the exemplary embodiment shown in, for example, FIG. 1, lies in the arrangement of the middle-layer structure 400. Only the difference between the 3D stacked packaging structure 10' and the 3D stacked packaging structure 10 will be described below, and the same reference numerals will be used for the same components in the two embodiments and their detailed description will be omitted.

In the exemplary embodiment shown in FIG. 9, the 3D stacked packaging structure 10' may include at least one middle-layer structure 400. In some embodiments, the number of middle-layer structures 400 may be one, two, or more. In embodiments of the present disclosure, the at least one middle-layer structure 400 may be located between the bottom-layer structure 100 and the top-layer structure 200. In some optional embodiments, the arrangement structure of the at least one middle-layer structure 400 may be basically the same as the arrangement structure of the top-layer structure 200 as shown in FIG. 8. In other words, the middle-layer structure 400 may also include a substrate layer, a diamond layer, an ion-implanted silicon wafer layer and a component layer, and the substrate layer, the diamond layer, the ion-implanted silicon wafer layer and the component layer are laminated together in this sequence. As an example, when the number of middle-layer structure 400 is one, the substrate layer of the middle-layer structure 400 may be in contact with the component layer of the bottom-layer structure 100, and the component layer of the middle-layer structure 400 may be in contact with the substrate layer of the top-layer structure 200. When the number of middle-layer structures 400 is more than one, the substrate layer of the middle-layer structure closest to the bottom-layer structure 100 in the middle-layer structures 400 may be in contact with the component layer of the bottom-layer structure 100, and the component layer of the middle-layer structure 400 closest to the top-layer structure 200 in the middle-layer structures 400 may be in contact with the substrate layer of the top-layer structure 200. In exemplary embodiments of the present disclosure, similar to the top-layer structure 200, the thickness of the substrate layer of the middle-layer structure 400 may also be smaller than the thickness of the substrate layer of the bottom-layer structure 100. In some embodiments, the substrate layers 110 of the bottom-layer structure 100, the top-layer structure 200, and the middle-layer structure 400 are thinned after the corresponding diamond layer 120 and component layer 140 are laminated. In some embodiments, the thickness of the substrate layer of the at least one middle-layer structure 400 may be the same as the thickness of the substrate layer of the top-layer structure 200. In other embodiments, the thickness of the substrate layer of the at least one middle-layer structure 400 may be smaller than the thickness of the substrate layer of the top-layer structure 200. Here, it should be noted that the substrate layer of the at least one middle-layer structure 400 may be provided in a way different from that.

As it may be seen in FIG. 9, the through holes 300 may be provided between at least two adjacent layer structures of the bottom-layer structure 100, the at least one middle-layer structure 400, and the top-layer structure 200. Specifically, as an example, when the 3D stacked packaging structure 10 includes two middle-layer structures 400, the through holes 300 may be provided in at least one of the following ways: the through holes 300 may extend through the component layer, the ion-implanted silicon wafer layer, the diamond layer, and the substrate layer of the top-layer structure 200, and extend through the component layer of the middle-layer structure adjacent to the top-layer structure 200, in the two middle-layer structures 400; one of the through holes 300 may extend through the component layer, the ion-implanted silicon wafer layer, the diamond layer, and the substrate layer of the middle-layer structure adjacent to the top-layer structure 200 in the two middle-layer structures 400, and extend through the component layer of the middle-layer structure adjacent to the bottom-layer structure 100 in the two middle-layer structures 400; the through holes 300 may extend through the component layer of the middle-layer structure adjacent to the top-layer structure 200 in the two middle-layer structures 400, and extend through the component layer of the bottom-layer structure 100; one through hole in the through holes 300 may extend through the component layer, the ion-implanted silicon wafer layer, the diamond layer, and the substrate layer of the top-layer structure 200, extend through the component layer, the ion-implanted silicon wafer layer, the diamond layer, and the substrate layer of the middle-layer structure adjacent to the top-layer structure 200 in the two middle-layer structures 400, and extend through the component layer of the middle-layer structure adjacent to the bottom-layer structure 100 in the two middle-layer structures 400; the through holes 300 may extend through the component layer of the middle-layer structure adjacent to the top-layer structure 200 in the two middle-layer structures 400, extend through the component layer, the ion-implanted silicon wafer layer, the diamond layer, and the substrate layer of the middle-layer structure adjacent to the bottom-layer structure 100 in the two middle-layer structures 400, and extend through the component layer of the bottom-layer structure 100; and, the through holes 300 may extend through the component layer, the ion-implanted silicon wafer layer, the diamond layer, and the substrate layer of the top-layer structure 200, extend through the component layer, the ion-implanted silicon wafer layer, the diamond layer, and the substrate layer of the middle-layer structure adjacent to the top-layer structure 200 in the two middle-layer structures 400, extend through the component layer, the ion-implanted silicon wafer layer, the diamond layer, and the substrate layer of the middle-layer structure adjacent to the bottom-layer structure 100 in the two middle-layer structures 400, and extend through the component layer of the bottom-layer structure 100.

It may be seen from FIG. 9 that the component layer side of the top-layer structure 200 of the 3D stacked packaging structure 10' may be covered with the plastic package layer 500.

In addition to basically the same technical effects as the 3D stacked packaging structure 10 of the previous embodiment, the 3D stacked packaging structure 10' according to the exemplary embodiment may also realize the packaging of more electronic devices.

Now referring to FIG. 10, FIG. 10 is a schematic sectional view of the 3D stacked packaging structure 10'' according to another exemplary embodiment of the present disclosure.

The difference between the 3D stacked packaging structure 10'' according to the embodiment shown in FIG. 10 and the aforementioned 3D stacked packaging structure 10' according to the exemplary embodiment shown in FIG. 9 lies in the arrangement of the component layer 140 of the bottom-layer structure 100 and the substrate layer 100 of the middle-layer structure closest to the bottom-layer structure 100 in the middle-layer structures 400. It should be noted that the through hole 300 is omitted in the 3D stacked packaging structure 10'' in FIG. 10. Only the difference between the 3D stacked packaging structure 10'' and the 3D stacked packaging structure 10' will be described below, and the same reference numerals will be used for the same components in the two embodiments and their detailed description will be omitted.

In the exemplary embodiment shown in FIG. 10, the component layer 140 of the bottom-layer structure 100 may include a functional chip. In this case, the substrate layer 110 of the middle-layer structure closest to the bottom-layer structure 100 in the middle-layer structures 400 may be rewired (the substrate layer 110 is the RDL), and may be provided with interconnection structures 600 communicating with the component layer. In some embodiments of the present disclosure, at least one of the component layer of the bottom-layer structure 100, the component layer of the at least one middle-layer structure 400, and the component layer of the top-layer structure 200 may include a functional chip, and a substrate layer adjacent to at least one of the component layer of the bottom-layer structure 100, the component layer of the at least one middle-layer structure 400, and the component layer of the top-layer structure 200 may be rewired and provided with interconnection structures 600 communicating with the component layer.

In addition to basically the same technical effect as the 3D stacked packaging structure 10' of the previous embodiment, the 3D stacked packaging structure 10'' according to the exemplary embodiment may also achieve better heat dissipation for the functional chip.

Figure 11:
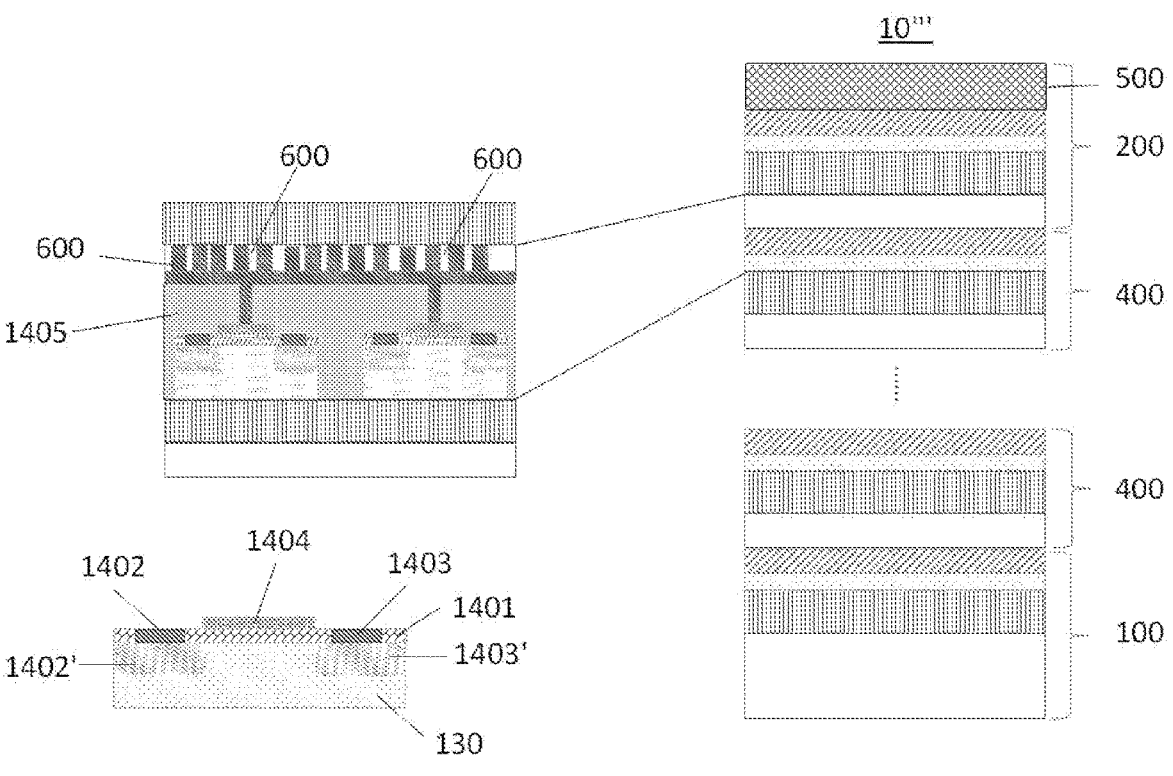
FIG. 11 is a schematic sectional view of the 3D stacked packaging structure according to another exemplary embodiment of the present disclosure, in which the component layer of the middle-layer structure includes semiconductor transistors, and the substrate layer of the top-layer structure in contact with the middle-layer structure is rewired and provided with at least one through hole.
Figure 12:
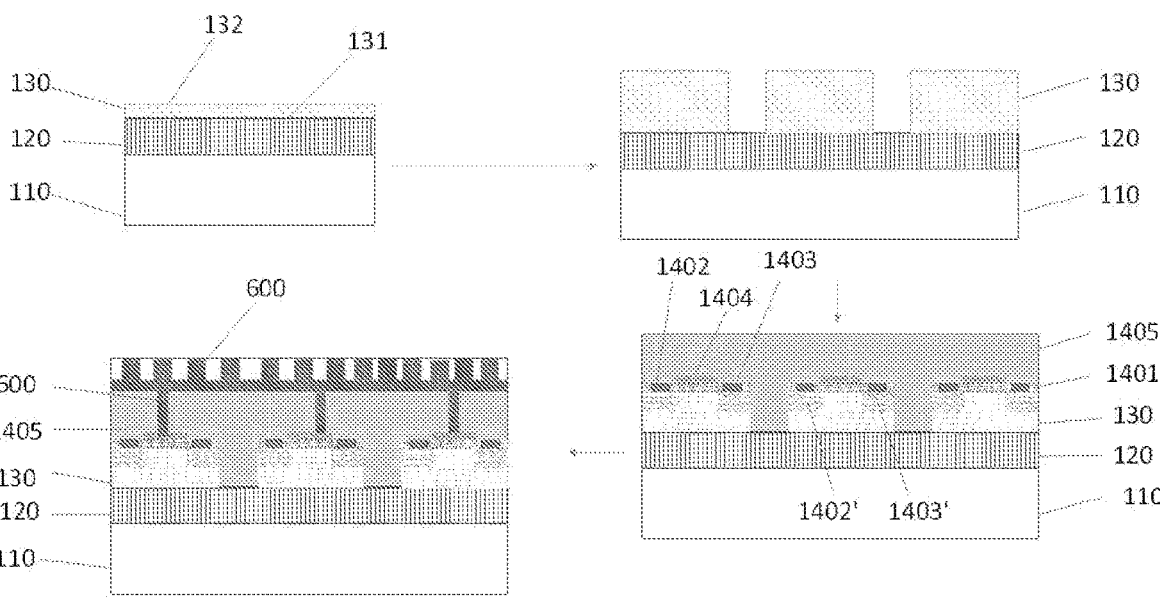
FIG. 12 is a schematic sectional view of the process of forming a semiconductor transistor on the silicon wafer layer according to an exemplary embodiment of the present disclosure.

Now referring to FIG. 11 and FIG. 12. FIG. 11 illustrates a schematic sectional view of a 3D stacked packaging structure 10''' according to another exemplary embodiment of the present disclosure. FIG. 12 illustrates a schematic sectional view of the process of forming a semiconductor transistor on the silicon wafer layer 103 according to an exemplary embodiment of the present disclosure.

As shown in FIG. 11, the functional chip of the component layer 104 of the middle-layer structure 400 may include semiconductor transistors. It should be noted that the drawing is only illustrative and not restrictive, and without departing from the spirit and scope of the present disclosure, the semiconductor transistors may not be limited to being formed only in the middle-layer structure 400, but may also be formed in top-layer structure 200 and/or the bottom-layer structure 100. In some embodiments, the semiconductor transistors may be included in the functional chip of the component layer 104 of at least one of the top-layer structure 200, the at least one middle-layer structure 400, and the bottom-layer structure 100. Next, the structure and formation process of the semiconductor transistor will be described in detail.

Referring to FIG. 11 and FIG. 12, the semiconductor transistor may include a dielectric layer 1401, a source 1402 provided in the dielectric layer 1401, a drain 1403 provided in the dielectric layer 1401, and a gate 1404 provided on the dielectric layer 1401. The silicon wafer layer 130 of at least one of the top-layer structure 200, the middle-layer structure 400 and the bottom-layer structure 100 that is provided with the semiconductor transistors may include a source doped region 1402' and a drain dope region 1403' located at two ends of the silicon wafer layer 130, and an undoped region located at the middle position of the silicon wafer layer 130. The source 1402 and the drain 1403 are formed above the source doped region 1402' and the drain doped region 1403' respectively, and the gate 1404 is formed above the undoped region.

Referring to FIG. 12 and referring back to FIG. 6, it may be understood that after the sanded second main surface 132 of the silicon wafer layer 130 is formed, holes may be provided in the silicon wafer layer 130 by an exposure/development method (e.g., photolithography) to form a pattern on the second main surface 132, and then semiconductor transistors are formed on the second main surface 132. In the 3D stacked packaging structure 10''' shown in FIG. 11 and FIG. 12, the substrate layer of the top-layer structure 200 in contact with the middle-layer structure 400 provided with the semiconductor transistors may be rewired and provided with the interconnection structures 600 that communicates with the gate 1404 of the component layer of the middle-layer structure 400.

According to an embodiment of the present disclosure, the diamond layer 120 is formed as a heat dissipation substrate of the semiconductor transistors, so that the heat concentration problem when the semiconductor transistors are working is solved through the diamond layer 120. In addition, since the sanding and polishing are performed on the silicon wafer layer 130, direct surface polishing of the diamond layer 120 is avoided, which may effectively reduce the manufacturing difficulty of the semiconductor transistors.

In some embodiments, referring to FIG. 11 and FIG. 12, the semiconductor transistor may further include an isolating layer 1405, where the isolating layer 1405 may pass through the silicon wafer layer 130 to be in contact with the diamond layer 120 of at least one of the top-layer structure 200, the middle-layer structure 400 and the bottom-layer structure 100 that is provided with the semiconductor transistors.

According to an exemplary embodiment of the present disclosure, a method for manufacturing the 3D stacked packaging structure 10, 10', 10" according to the aforementioned exemplary embodiment is also provided. It should be understood that the method for manufacturing the 3D stacked packaging structure provided by the present disclosure may at least achieve various beneficial technical effects described above of the 3D stacked packaging structure 10, 10', 10".

According to the 3D stacked packaging structure of the embodiments of the present disclosure, since the diamond with high thermal conductivity is used to form a base in more than one layer structure of the 3D stacked packaging structure, the heat dissipation performance of the formed 3D stacked packaging structure is improved. In addition, by reducing the thickness of the substrate layer of the top-layer structure and providing through holes in the 3D stacked packaging structure, the heat dissipation performance of the 3D stacked packaging structure is further improved.

According to the 3D stacked packaging structure of the embodiments of the present disclosure, the diamond layer is formed as a heat dissipation substrate of the semiconductor transistors, so the heat concentration problem when the semiconductor transistors are working is solved through the diamond layer. In addition, since sanding and polishing are performed on the silicon wafer layer, direct surface polishing of the diamond layer is therefore avoided, which may effectively reduce the manufacturing difficulty of the semiconductor transistors.

Although the present disclosure has been described with reference to the exemplary embodiments, it should be understood that the present disclosure is not limited to the described embodiments. Various changes may be made to the exemplary embodiments by those skilled in the art without departing from the technical idea of the present disclosure.

Features mentioned and/or illustrated in the above description of exemplary embodiments of the present disclosure may be incorporated into one or more other embodiments in the same or similar manner, combined with features from other embodiments, or substituted for corresponding features in other embodiments. These technical solutions obtained by combination or substitution should also be deemed to be included in the scope of the present disclosure.

The exemplary embodiments of the present disclosure further provide a method for manufacturing the above-mentioned 3D stacked packaging structure, which method may include the following steps:

providing the top-layer structure and the bottom-layer structure, wherein the providing the top-layer structure and the providing the bottom-layer structure, respectively, include: providing the substrate layer; growing the diamond layer on the substrate layer; attaching the ion-implanted silicon wafer layer to the diamond layer; providing the component layer on the ion-implanted silicon wafer layer;

and sequentially laminating the substrate layer, the diamond layer, the ion-implanted silicon wafer layer, and the component layer together;

stacking the top-layer structure on the bottom-layer structure, to make the substrate layer of the top-layer structure in contact with the component layer of the bottom-layer structure;

providing the at least one through hole between the bottom-layer structure and the top-layer structure, to make the at least one through hole extend through the component layer, the ion-implanted silicon wafer layer, the diamond layer, and the substrate layer of the top-layer structure, and extend through the component layer of the bottom-layer structure; and filling the conductive material in the at least one through hole.

In some optional embodiments, the method may further include the following steps: providing a silicon wafer; performing ion implantation on one side surface of the silicon wafer; attaching the ion-implanted surface of the silicon wafer to the diamond layer as a first main surface of the ion-implanted silicon wafer layer; peeling off the portion of the silicon wafer that is not implanted with ions; sanding a surface of the silicon wafer exposed by the peeling off, to obtain a second main surface of the ion-implanted silicon wafer layer; and providing the component layer on the second main surface of the ion-implanted silicon wafer layer.

The 3D stacked packaging structure prepared by the method for manufacturing the above-mentioned 3D stacked packaging structure provided by the exemplary embodiments of the present disclosure has the beneficial technical effects as mentioned above, which will not be described in detail herein.

INDUSTRIAL APPLICABILITY

The present disclosure provides a 3D stacked packaging structure and a manufacturing method thereof. The 3D stacked packaging structure includes a bottom-layer structure and a top-layer structure, wherein the top-layer structure is stacked on the bottom-layer structure, and each of the bottom-layer structure and the top-layer structure includes: a substrate layer; a diamond layer, wherein the diamond layer is grown on the substrate layer; an ion-implanted silicon wafer layer, wherein the ion-implanted silicon wafer layer is attached to the diamond layer; a component layer, wherein the component layer is provided on the silicon wafer layer. The substrate layer, the diamond layer, the ion-implanted silicon wafer layer, and the component layer are stacked together in sequence, and the substrate layer of the top-layer structure is in contact with the component layer of the bottom-layer structure, and at least one through hole is provided between the bottom-layer structure and the top-layer structure, the at least one through hole extends through the component layer, the ion-implanted silicon wafer layer, the diamond layer, and the substrate layer of the top-layer structure, and extends through the component layer of the bottom-layer structure, wherein the at least one trough hole is filled with a conductive material.

It can be understood that the 3D stacked packaging structure and its manufacturing method provided by the present disclosure are reproducible and may be used in a variety of industrial applications.

What is claimed is:

1. A 3D stacked packaging structure, comprising a bottom-layer structure and a top-layer structure, wherein the top-layer structure is stacked on the bottom-layer structure, and each of the bottom-layer structure and the top-layer structure comprises:

a substrate layer;

a diamond layer, wherein the diamond layer is grown on the substrate layer;

an ion-implanted silicon wafer layer, wherein the ion-implanted silicon wafer layer is attached to the diamond layer; and a component layer, wherein the component layer is provided on the silicon wafer layer, wherein the substrate layer, the diamond layer, the ion-implanted silicon wafer layer, and the component layer are stacked together in sequence, and the substrate layer of the top-layer structure is in contact with the component layer of the bottom-layer structure, and at least one through hole is provided between the bottom-layer structure and the top-layer structure, the at least one through hole extend through the component layer, the ion-implanted silicon wafer layer, the diamond layer, and the substrate layer of the top-layer structure, and extends through the component layer of the bottom-layer structure, wherein the at least one through hole is filled with a conductive material.

2. The 3D stacked packaging structure according to claim 1, further comprising at least one middle-layer structure, wherein the at least middle-layer structure is located between the bottom-layer structure and the top-layer structure, and an arrangement structure of the at least one middle-layer structure is same as an arrangement structure of the top-layer structure, wherein the at least one through hole is provided between at least two adjacent layer structures among the bottom-layer structure, the at least one middle-layer structure, and the top-layer structure.

3. The 3D stacked packaging structure according to claim 2, wherein the component layer of at least one of the bottom-layer structure, the at least one middle-layer structure, and the top-layer structure comprises semiconductor transistors, and interconnecting wires and insulating materials between the semiconductor transistors.

4. The 3D stacked packaging structure according to claim 2, wherein the substrate layer of each of the bottom-layer structure, the top-layer structure, and the at least one middle-layer structure is thinned after the corresponding diamond layer and the corresponding component layer are stacked.

5. The 3D stacked packaging structure according to claim 4, wherein a thickness of the substrate layer of the at least one middle-layer structure and a thickness of the substrate layer of the top-layer structure are 1 μm to 100 μm.

6. The 3D stacked packaging structure according to claim 2, wherein a thickness of the diamond layer is 1 μm to 3 μm.

7. The 3D stacked packaging structure according to claim 2, wherein a thickness of the ion-implanted silicon wafer layer is 1 μm to 10 μm.

8. The 3D stacked packaging structure according to claim 4, wherein the component layer of at least one of the bottom-layer structure, the at least one middle-layer structure, and the top-layer structure comprises a functional chip, and the substrate layer adjacent to the component layer of the at least one of the bottom-layer structure, the at least one middle-layer structure, and the top-layer structure is rewired and provided with interconnection structures communicating with the component layer of the at least one of the bottom-layer structure, the at least one middle-layer structure, and the top-layer structure.

9. The 3D stacked packaging structure according to claim 8, wherein the functional chip comprises semiconductor transistors, each of the semiconductor transistors comprises a dielectric layer, a source provided in the dielectric layer, a drain provided in the dielectric layer, and a gate provided on the dielectric layer, the silicon wafer layer of at least one of the bottom-layer structure, the at least one middle-layer structure, and the top-layer structure comprises a source doped region and a drain doped region located at two ends of the silicon wafer layer, and an undoped region located at a middle position of the silicon wafer layer, the source electrode and the drain electrode of the semiconductor transistor are formed above the source doped region and the drain doped region respectively, and the gate of the semiconductor transistor is formed above the undoped region.

10. The 3D stacked packaging structure according to claim 9, wherein the semiconductor transistor further comprises an isolating layer, wherein the isolating layer extends through the corresponding silicon wafer layer and is in contact with the corresponding diamond layer.

11. The 3D stacked packaging structure according to claim 1, wherein the component layer of the top-layer structure is covered with a plastic package layer.

12. A method for manufacturing the 3D stacked packaging structure according to claim 1, comprising:

providing the top-layer structure and the bottom-layer structure, wherein the providing the top-layer structure and the providing the bottom-layer structure, respectively, comprise:

providing the substrate layer;

growing the diamond layer on the substrate layer;

attaching the ion-implanted silicon wafer layer to the diamond layer;

providing the component layer on the ion-implanted silicon wafer layer; and sequentially laminating the substrate layer, the diamond layer, the ion-implanted silicon wafer layer, and the component layer together;

stacking the top-layer structure on the bottom-layer structure, to make the substrate layer of the top-layer structure in contact with the component layer of the bottom-layer structure;

providing the at least one through hole between the bottom-layer structure and the top-layer structure, to make the at least one through hole extend through the component layer, the ion-implanted silicon wafer layer, the diamond layer, and the substrate layer of the top-layer structure, and extend through the component layer of the bottom-layer structure; and filling the conductive material in the at least one through hole.

13. The method for manufacturing the 3D stacked packaging structure according to claim 12, further comprising:

providing a silicon wafer;

performing ion implantation on one side surface of the silicon wafer;

attaching the ion-implanted surface of the silicon wafer to the diamond layer, as a first main surface of the ion-implanted silicon wafer layer;

peeling off a portion of the silicon wafer that is not implanted with ions;

polishing a surface of the silicon wafer exposed by the peeling off, to obtain a second main surface of the ion-implanted silicon wafer layer; and providing the component layer on the second main surface of the ion-implanted silicon wafer layer.

14. The 3D stacked packaging structure according to claim 1, wherein the substrate layer is a silicon substrate or a glass substrate.

15. The 3D stacked packaging structure according to claim 1, wherein the diamond layer has an upper surface and a lower surface that are opposite to each other, the lower surface is in contact with the substrate layer, and the lower surface is polished.

16. The 3D stacked packaging structure according to claim 15, wherein a thickness of the polished lower surface of the diamond layer is 0 to 70 nm.

17. The 3D stacked packaging structure according to claim 1, wherein the silicon wafer layer has a first side surface and a second side surface that is opposite to the first side surface, and the second side surface is closer to the diamond layer than the first side surface.

18. The 3D stacked packaging structure according to claim 17, wherein a portion of the first side surface of the silicon wafer layer is implanted with ions, so that the first side surface of the silicon wafer layer is formed as a first main surface of the silicon wafer layer.

19. The 3D stacked packaging structure according to claim 18, wherein an ion implantation depth is 1 μm to 10 μm.

20. The 3D stacked packaging structure according to claim 1, wherein a diamond of the diamond layer is at least one selected from the group consisting of a single crystal diamond, a polycrystalline diamond, and a composite material of the single crystal diamond and the polycrystalline diamond.

* * * * *